United States Patent
Britton et al.

[11] Patent Number: 5,986,471
[45] Date of Patent: Nov. 16, 1999

[54] BI-DIRECTIONAL BUFFERS AND SUPPLEMENTAL LOGIC AND INTERCONNECT CELLS FOR PROGRAMMABLE LOGIC DEVICES

[75] Inventors: Barry K. Britton, Orefield, Pa.; Kai-Kit Ngai, Campbell, Calif.; Ho T. Nguyen, Allentown, Pa.; Satwant Singh, Macungie, Calif.; Carolyn W. Spivak, Emmaus; Richard G. Stuby, Jr., New Tripoli, both of Pa.

[73] Assignee: Lucent Technologies Inc., Murray Hill, N.J.

[21] Appl. No.: 08/950,446

[22] Filed: Oct. 15, 1997

[51] Int. Cl.⁶ .............. H03K 19/00; G06F 7/38
[52] U.S. Cl. .................. 326/57; 326/56; 326/37
[58] Field of Search ................. 326/56, 57, 58, 326/59, 40, 41, 44

[56] References Cited

U.S. PATENT DOCUMENTS

| | | | |
|---|---|---|---|
| 5,191,555 | 3/1993 | Tabacco et al. | 365/230.08 |
| 5,367,208 | 11/1994 | El Gamal et al. | 326/44 |
| 5,550,782 | 8/1996 | Cliff et al. | 365/230.08 |
| 5,804,986 | 9/1998 | Jones | 326/40 |

*Primary Examiner*—David Nelms
*Assistant Examiner*—Anh Phung

[57] ABSTRACT

The bi-directional (BI-DI) buffers and supplemental logic and interconnect (SLIC) cells are designed to be programmed to operate in different modes in order to implement different kinds of logic circuits. In particular, BI-DI buffers of the present invention support at least five different operational modes. In a first mode (Mode A), the BI-DI buffer generates a logic "1" output, for any input value. In a second mode (Mode B), the BI-DI buffer generates a logic "0" output, for any input value. In a third mode (Mode C), the BI-DI buffer buffers the input signal and generates an output signal equal to the input signal. In a fourth mode (Mode D), the BI-DI buffer buffers the input signal and generates an output signal equal to the inverse of the input signal. In a fifth mode, (Mode E), the BI-DI buffer operates as a conventional tri-state driver. Two or more of the BI-DI buffers can be configured to form more complex logic circuits having two or more inputs. For example, groups of BI-DI buffers can be configured as SLIC cells that are part of the basic logic cells for an FPGA. When used in FPGAs, the BI-DI buffers and SLIC cells make implementation of different kinds of logic circuits more efficient than is the case for conventional FPGAs, including logic circuits like decoders and state machines that have large numbers of inputs. At the same time, the FPGAs retain their efficiencies for implementing logic circuits for which FPGAs have traditionally been very efficient, such as random logic and datapath logic.

22 Claims, 7 Drawing Sheets

BI-DIRECTIONAL BUFFERS AND SUPPLEMENTAL LOGIC AND INTERCONNECT CELLS FOR PROGRAMMABLE LOGIC DEVICES

BACKGROUND OF THE INVENTION

1. Field of the Invention

The present invention relates to integrated circuits, and, in particular, to high-density programmable logic devices, such as field programmable gate arrays.

2. Description of the Related Art

In the past, high-density programmable logic devices (PLDs) have been divided into two types: field programmable gate arrays (FPGAs) and complex programmable logic devices (CPLDs). Since the logic cells that are typically used as the building blocks for each of these two types of devices are different, the devices tend to be more suitable for different types of applications. FPGAs generally have logic cells with a small number of inputs, such as discrete gates, multiplexers, and/or look-up tables (LUTs). As such, FPGAs are typically well suited for implementing datapath logic and random logic. For FPGAs that have LUTs as the basic building block, random access memory (RAM) is typically used to create the LUTs. If the LUTs are not being used to create logic functions, these RAM cells can be used to create large RAM structures.

CPLDs, on the other hand, generally have logic cells that have more inputs than FPGA logic cells. For example, CPLD logic cells may be based on programmed array logic (PAL) using AND-OR planes. Like FPGAs, CPLDs are typically well suited for implementing random logic, but CPLDs are also well suited for implementing logic circuits that require a large number of inputs, such as decoders and state machines. On the other hand, CPLDs are not well suited for implementing datapath logic.

A typical decoder receives many inputs and generates a single valid output signal (e.g., high) for only one particular combination of inputs. Because many conventional FPGAs are based on logic cells having relatively few inputs (e.g., LUTs with 4 inputs each), such FPGAs are not well suited for implementing circuits like decoders and state machines that require large numbers of inputs. For example, implementing a relatively simple 10-input decoder in a conventional LUT-based FPGA would require at least three 4-input LUTs configured in two different stages. The speed of such a two-stage decoder would be prohibitively slow for many applications.

SUMMARY OF THE INVENTION

The present invention is directed to a programmable bidirectional (BI-DI) buffer and supplemental logic and interconnect (SLIC) cells for integrated circuits such as field programmable gate arrays. The SLIC cells are configured with a plurality of the BI-DI buffers. The BI-DI buffers and SLIC cells are designed to be programmed to operate in different modes in order to implement different kinds of logic circuits. When used in FPGAs, BI-DI buffers and SLIC cells of the present invention make implementation of different kinds of logic circuits in FPGAs more efficient than is the case for conventional FPGAs, including logic circuits like decoders and state machines that have large numbers of inputs. At the same time, the FPGAs retain their efficiencies for implementing logic circuits for which FPGAS have traditionally been very efficient, such as random logic and datapath logic through the continued use of FPGA-like logic blocks, such as LUTs.

In particular, BI-DI buffers of the present invention support at least five different operational modes. In a first mode (Mode A), the BI-DI buffer generates a logic "1" output, for any input value. In a second mode (Mode B), the BI-DI buffer generates a logic "0" output, for any input value. In a third mode (Mode C), the BI-DI buffer buffers the input signal and generates an output signal equal to the input signal. In a fourth mode (Mode D), the BI-DI buffer buffers the input signal and generates an output signal equal to the inverse of the input signal. In a fifth mode, (Mode E), the BI-DI buffer operates as a conventional tri-state driver.

Two or more BI-DI buffers of the present invention can be configured to form more complex logic circuits having two or more inputs. For example, groups of BI-DI buffers can be configured as SLIC cells that are part of the basic logic cells for an FPGA. When the FPGA is configured, the SLIC cells can be programmed to implement a wide variety of types of logic circuits requiring a large number of inputs in the FPGA, including decoders and state machines as well as random logic.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 1:
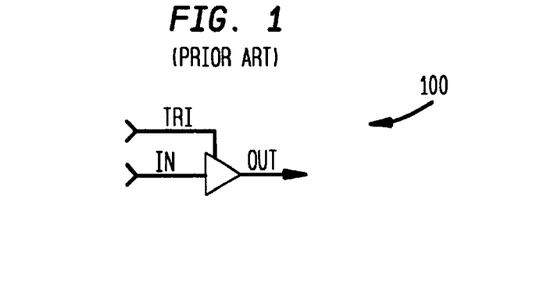
FIG. 1 shows a functional block diagram of a prior-art tri-state driver.

FIG. 1 shows a functional block diagram of a prior-art tri-state driver 100 typically used to drive internal tri-state buses in both conventional FPGAs and CPLDs. Tri-state driver 100 receives an input signal IN and a tri-state control signal TRI, and generates an output signal OUT. Table I shows the functionality of tri-state driver 100. As shown in Table I, when the tri-state control signal TRI is 0, the driver functions as a simple buffer that buffers and generates an output signal OUT equal to the input signal IN. However, when the tri-state control signal TRI is 1, tri-state driver 100 is essentially turned off. As a result, the output signal OUT is independent of the input signal IN, and is, in fact, indeterminate with respect to the input signal IN.

TABLE I

PRIOR-ART TRI-STATE DRIVER FUNCTIONALITY

| Tri-State Signal (TRI) | Input Signal (IN) | Output Signal (OUT) |
|---|---|---|
| 0 | 0 | 0 |
| 0 | 1 | 1 |

TABLE I-continued

PRIOR-ART TRI-STATE DRIVER FUNCTIONALITY

| Tri-State Signal (TRI) | Input Signal (IN) | Output Signal (OUT) |
|---|---|---|
| 1 | 0 | Indeterminate |
| 1 | 1 | Indeterminate |

Figure 2:
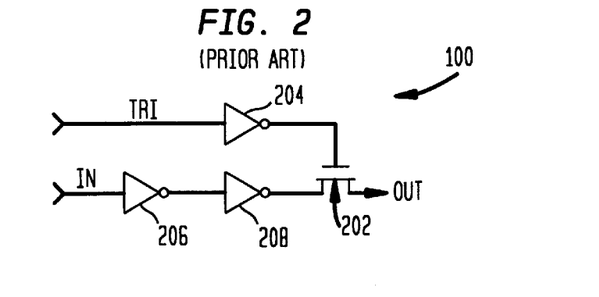
FIG. 2 shows a schematic diagram of a typical implementation of the tri-state driver of FIG. 1.

FIG. 2 shows a schematic diagram of a typical implementation of tri-state driver 100 of FIG. 1. As shown in FIG. 2, tri-state driver 100 comprises a pass gate 202, a tri-state inverting buffer 204, and two input inverting buffers 206 and 208. When the tri-state control signal TRI is low, the tri-state inverting buffer 204 turns on pass gate 202 which passes the twice-inverted input signal IN to the output signal OUT. When the tri-state control signal TRI is high, the tri-state inverting buffer 204 turns off pass gate 202, which blocks the input signal IN from being passed to the output, leaving the output signal OUT indeterminate.

Figure 3:
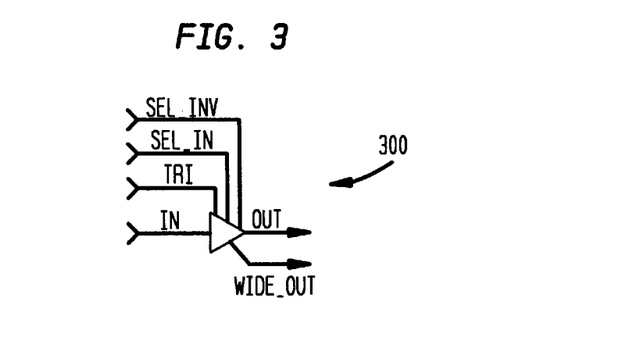
FIG. 3 shows a functional block diagram of a bi-directional buffer, according to one embodiment of the present invention.
Figure 4:
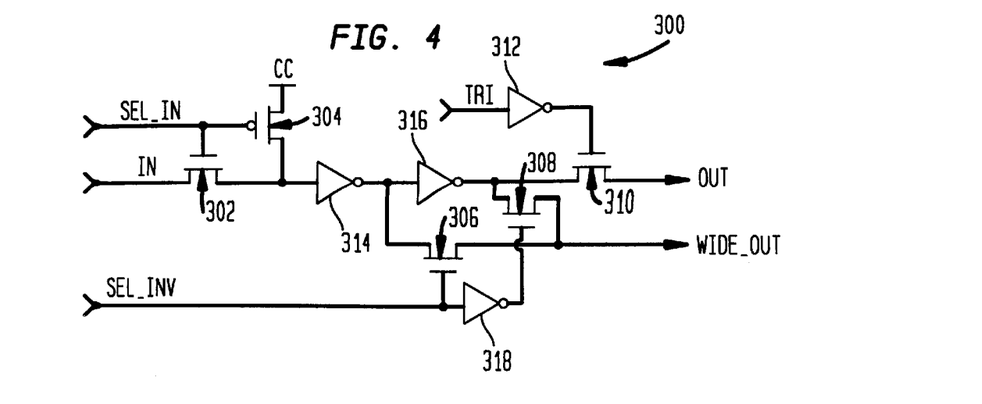
FIG. 4 shows a schematic diagram of the bi-directional buffer of FIG. 3, according to one possible implementation of the present invention.

FIG. 3 shows a functional block diagram of a bi-directional buffer 300, according to one embodiment of the present invention. BI-DI buffer 300 receives an input signal IN, a tri-state control signal TRI, and two additional control signals SEL_IN and SEL_NV, and generates two output signals OUT and WIDE_OUT. Table II shows the functionality of BI-DI buffer 300. The 16 different states listed in Table II correspond to the 16 different possible combinations of input signal IN, tri-state control signal TRI, and control signals SEL_IN and SEL_INV. Each state corresponds to a specific set of output signals OUT and WIDE_OUT. These 16 different states can be associated with six different BI-DI buffer operational modes, which are also listed in Table II.

pass gate 308 is off. Lastly, when TRI is low, pass gate 310 is on (as a result of inverting buffer 312). Conversely, when TRI is high, pass gate 310 is off. As described in the following two sections, these three control signals control the generation of the two output signals OUT and WIDE_OUT by dictating whether the input signal IN, the bias signal CC, or no signal is passed on to the output signals and in what form (e.g., once or twice inverted).

Generation of the First Output Signal OUT

When SEL_IN is high (see States 9–16), pass gate 302 is on, pass gate 304 is off, and the input signal IN is passed on to the configuration of pass gate 310 and inverting buffers 312–316, which configuration operates analogously to conventional tri-state driver 100 of FIG. 2 to generate the first output signal OUT. That is, with SEL_IN high, when TRI is low, pass gate 310 is on and the input signal IN is passed, after being twice inverted, to the first output signal OUT (see States 9–10 and 13–14). On the other hand, with SEL_IN high, when TRI is high, pass gate 310 is off, the input signal IN is blocked, and the first output signal OUT is indeterminate (see States 11–12 and 15–16).

When SEL_IN is low (see States 1–8), pass gate 302 is off, pass gate 304 is on, the input signal IN is blocked, and the bias signal CC (e.g., a high signal corresponding to a logic "1") is passed on to inverting buffer 314. Thus, with SEL_IN low, when TRI is low, pass gate 310 is on and the bias signal CC is passed, after being twice inverted, to the first output signal OUT (see States 1–2 and 5–6). On the other hand, with SEL_IN low, when TRI is high, pass gate 310 is off, the bias signal CC is blocked, and the first output signal OUT is indeterminate (see States 3–4 and 7–8).

Note that SEL_INV has no affect on the generation of the first output signal OUT.

Generation of the Second Output Signal WIDE OUT

When SEL_INV is high (see States 5–8 and 13–16), pass gate 306 is on and pass gate 308 is off. With SEL_INV high,

TABLE II

BI-DI BUFFER FUNCTIONALITY

| State | SEL_IN | SEL_INV | Tri-State (TRI) | Input (IN) | 1st Output (OUT) | 2nd Output (WIDE_OUT) | Mode |
|---|---|---|---|---|---|---|---|
| 1 | 0 | 0 | 0 | 0 | 1 | 1 | A, F |
| 2 | 0 | 0 | 0 | 1 | 1 | 1 | A, F |
| 3 | 0 | 0 | 1 | 0 | Indeterm. | 1 | A, F |
| 4 | 0 | 0 | 1 | 1 | Indeterm. | 1 | A, F |
| 5 | 0 | 1 | 0 | 0 | 1 | 0 | B, F |
| 6 | 0 | 1 | 0 | 1 | 1 | 0 | B, F |
| 7 | 0 | 1 | 1 | 0 | Indeterm. | 0 | B, F |
| 8 | 0 | 1 | 1 | 1 | Indeterm. | 0 | B, F |
| 9 | 1 | 0 | 0 | 0 | 0 | 0 | C, E |
| 10 | 1 | 0 | 0 | 1 | 1 | 1 | C, E |
| 11 | 1 | 0 | 1 | 0 | Indeterm. | 0 | C, E |
| 12 | 1 | 0 | 1 | 1 | Indeterm. | 1 | C, E |
| 13 | 1 | 1 | 0 | 0 | 0 | 1 | D, E |
| 14 | 1 | 1 | 0 | 1 | 1 | 0 | D, E |
| 15 | 1 | 1 | 1 | 0 | Indeterm. | 1 | D, E |
| 16 | 1 | 1 | 1 | 1 | Indeterm. | 0 | D, E |

FIG. 4 shows a schematic diagram of BI-DI buffer 300 of FIG. 3, according to one possible implementation of the present invention. The tri-state control signal TRI and the two control signals SEL_IN and SEL_INV dictate the states of pass gates 302 and 304, 306 and 308, and 310, respectively. In particular, when SEL_IN is high, pass gate 302 is on and pass gate 304 is off. Conversely, when SEL_IN is low, pass gate 302 is off and pass gate 304 is on. Similarly, when SEL_INV is low, pass gate 306 is off and pass gate 308 is on (as a result of inverting buffer 318). Conversely, when SEL_INV is high, pass gate 306 is on and when SEL_IN is high, pass gate 302 is on, pass gate 304 is off, and the input signal IN is passed through pass gate 306, after being once inverted by inverting buffer 314, to the second output signal WIDE_OUT (see States 13–16). On the other hand, with SEL_INV high, when SEL_IN is low, pass gate 302 is off, pass gate 304 is on, the input signal IN is blocked, and the bias signal CC applied to pass gate 304 is passed through pass gate 306, after being once inverted by inverting buffer 314, to the second output signal WIDE_OUT (see States 5–8).

When SEL_INV is low (see States 1–4 and 9–12), pass gate 306 is off and pass gate 308 is on. With SEL_INV low, when SEL_IN is high, pass gate 302 is on, pass gate 304 is off, and the input signal IN is passed through pass gate 308, after being twice inverted by inverting buffers 314 and 316, to the second output signal WIDE_OUT (see States 9–12). On the other hand, with SEL_INV low, when SEL_IN is low, pass gate 302 is off, pass gate 304 is on, the input signal IN is blocked, and the bias signal CC applied to pass gate 304 is passed through pass gate 308, after being twice inverted by inverting buffers 314 and 316, to the second output signal WIDE_OUT (see States 1–4).

Note that the tri-state control signal TRI has no affect on the generation of the second output signal WIDE_OUT.

Operational Modes

The functionality of BI-DI buffer 300 of FIGS. 3 and 4, as described in the previous two sections, can be grouped into the six different operational modes identified in Table II. These six operational modes are summarized in Table III. In particular, in Mode A, the second output signal WIDE_OUT is always high (logic "1"), for any value of input signal IN. In Mode B, the second output signal WIDE_OUT is always low (logic "0"), for any value of input signal IN. In Mode C, the second output signal WIDE_OUT is equal to input signal IN. In this mode, BI-DI buffer 300 operates as a simple buffer. In Mode D, the second output signal WIDE_OUT is equal to the inverse of input signal IN. In this mode, BI-DI buffer 300 operates as an inverting buffer. In Mode E, the first output signal OUT is equal to the input signal IN, when TRI is low, and OUT is indeterminate, when TRI is high. Mode E corresponds to the functionality of a conventional tri-state driver, such as driver 100 of FIGS. 1–2. In Mode F, the first output signal OUT is high, when TRI is low, and OUT is indeterminate, when TRI is high. In either case, the first output signal is independent of the input signal IN. It will be understood that, in an alternative embodiment, BI-DI buffer 300 could be designed such that, for Mode F, the first output signal OUT would be low, rather than high, when TRI is low. As such, Mode F can be generalized such that the first output signal OUT is either a fixed bias signal (either high or low, depending on the implementation) or indeterminate, as dictated by TRI.

TABLE III

BI-DI BUFFER OPERATIONAL MODES

| Mode | SEL_IN | SEL_INV | TRI | FUNCTION |
| --- | --- | --- | --- | --- |
| A | 0 | 0 | — | WIDE_OUT = "1" |
| B | 0 | 1 | — | WIDEOUT = "0" |
| C | 1 | 0 | — | WIDEOUT = IN |
| D | 1 | 1 | — | WIDEOUT = $\overline{IN}$ |
| F | 1 | — | 0 | OUT = "1" |
| F | 1 | — | 1 | OUT = Indeterminate |
| E | 1 | — | 0 | OUT = IN |
| E | 1 | — | 1 | OUT = Indeterminate |

As shown in Table II, BI-DI buffer 300 operates in Mode F at the same time as either Mode A (see States 1–4) or Mode B (see States 5–8). Similarly, BI-DI buffer 300 operates in Mode E at the same time as either Mode C (see States 9–12) or Mode D (see States 13–16). In order to keep the first output signal OUT from interfering with other signals being routed on the device, it may be preferable to have the first output signal OUT tri-stated (i.e., indeterminate) whenever the second output signal WIDE_OUT is the only desired output from BI-DI buffer 300. In other words, from a circuit-level operational perspective, it may be preferable to set the tri-state control signal TRI to "1" for Modes A-D, even though, strictly speaking, the second output signal WIDE_OUT is independent of TRI.

Each BI-DI buffer can be programmed to function in any of these six different available operational modes by selecting the appropriate values for control signals SEL_IN, SEL_INV, and TRI. Typically, the signals SEL_IN and SEL_INV are selected when the device is configured and remain fixed during operation. For example, each of these control signals could be connected to the output of a configuration static RAM (SRAM) or other programming element such as EPROM, Fuse, Anti-Fuse, etc.

Two or more BI-DI buffers of the present invention can be configured together to form more complex logic circuits, including complex logic circuits that have typically been implemented only on CPLDs. BI-DI buffers can be configured into logic circuits having a large number of inputs, such as decoders and state machines. In particular, the WIDE_OUT signals from multiple BI-DI buffers can be used to create wide functions. In general, any wide function can be created where the signals from each BI-DI buffer can be from the input signal, inverted from the input signal, or tied to logic "0" or logic "1". Nevertheless, because BI-DI buffers of the present invention are very efficient in both the device area required and the speed of signals that propagate through them, the resulting logic circuits can be efficiently implemented on FPGAs notwithstanding the large numbers of inputs involved.

Furthermore, depending on the particular configuration, the BI-DI buffers in these more complex logic circuits can be programmed, dependently or independently, to provide different operational modes at the logic-circuit level. For each logic-circuit mode, some of the BI-DI buffers may be able to be programmed to operate in one BI-DI buffer mode, while one or more other BI-DI buffers are programmed to operate in one or more other BI-DI buffer modes. Moreover, different BI-DI buffers can be configured to operate simultaneously (e.g., within a single same stage), while others can be configured to interact with each other between different stages (e.g., using an output of one BI-DI buffer to drive an input or control signal of another BI-DI buffer).

Figure 5:
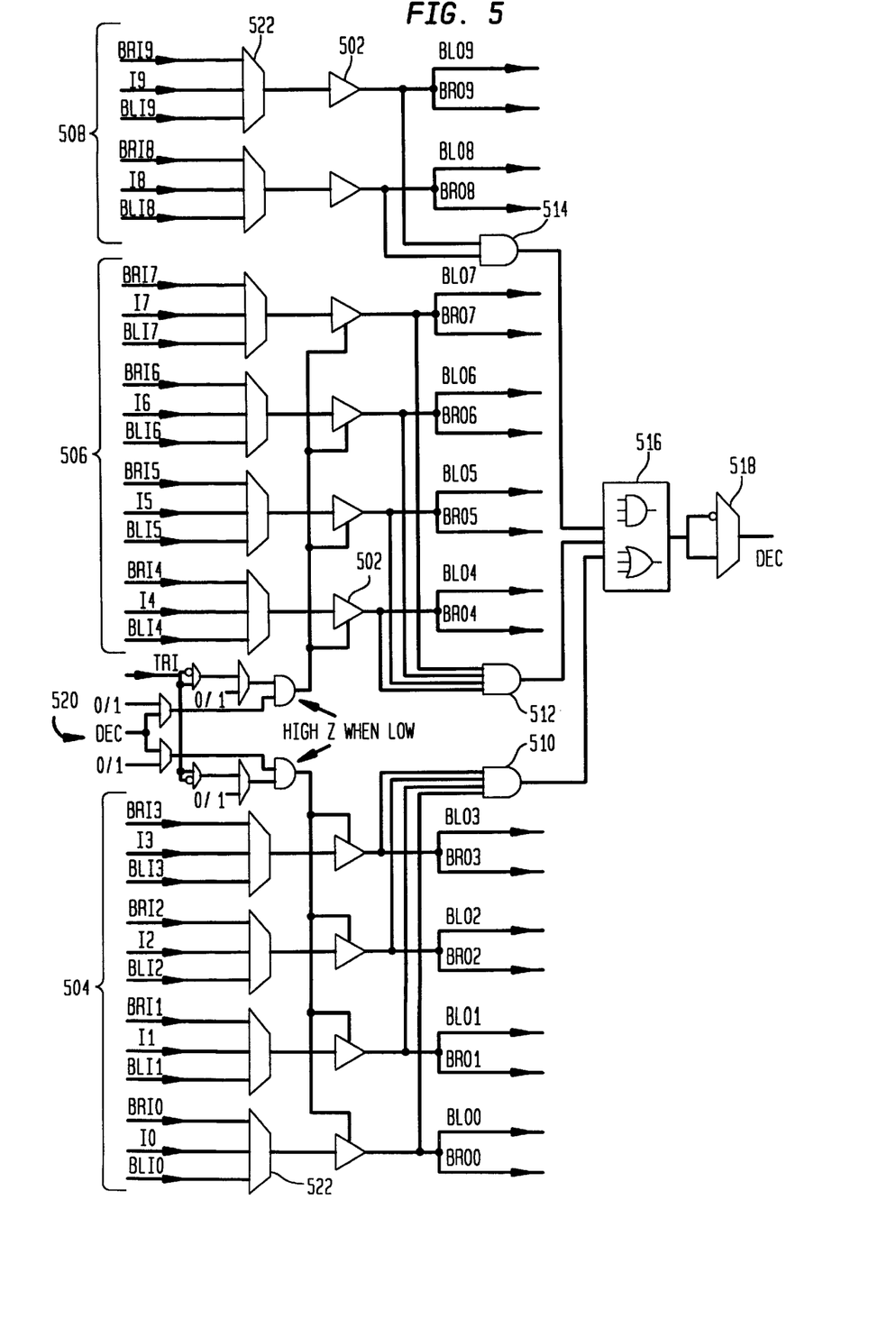
FIG. 5 shows a schematic drawing of a supplemental logic and interconnect (SLIC) cell, according to one embodiment of the present invention.

FIG. 5 shows a schematic drawing of a supplemental logic and interconnect (SLIC) cell 500, according to one embodiment of the present invention. According to the present invention, an FPGA can be designed such that each programmable logic cell (PLC) in the FPGA contains a SLIC cell embedded within the PLC routing, outside of the main programmable function unit (PFU) where the normal FPGA logic such as LUTs resides. As its name indicates, a SLIC cell performs both logic and interconnect (routing) functions. Its main features are tri-statable, bidirectional buffers and a PAL-like decoder capability.

SLIC cell 500 of FIG. 5 has ten bidirectional buffers 502 similar to BI-DI buffer 300 of FIGS. 3–4, with each buffer being capable of driving left and/or right out of the SLIC cell. These BI-DI buffers are also twin-quad in nature and are segregated into two groups of four BI-DI buffers each (nibbles 504 and 506) and a third group 508 of two BI-DI buffers. Each of these groups of BI-DI buffers can drive from the left (BLI[9:0]) to the right (BRO[9:0]), the right (BRI [9:0]) to the left (BLO[9:0]), or from central input (I[9:0]) to the left and/or right. This central input comes directly from the PFU outputs. Each of the BI-DI buffers in the nibble-wide groups (504 and 506) also has a tri-state buffer capability, but not the two BI-DI buffers in the third group (508). This highlights the fact that not all BI-DI buffers need to implement all of the possible modes.

Each group of buffers can feed into an AND gate (4-input AND gates 510 and 512 for nibble groups 504 and 506, respectively, and 2-input AND gate 514 for group 508). These AND gates then feed into a three-input gate 516 that can be configured as either an AND gate or an OR gate. The output 10 of three-input gate 516 is invertible (518) and is output at the DEC output of the SLIC cell, which can in turn be gated to the tri-state input TRI (520). SLIC cell 500 is an example of a set of BI-DI buffers that can be configured for simultaneous operation to create AND-OR (PAL-like) logic, where each sub-block of BI-DI buffers creates the required AND function of its inputs, where each input can be non-inverted (Mode C), inverted (Mode D), or ignored (Modes A/B), and then sends the sub-block output to a large OR gate, thus creating the AND-OR function.

SLIC cell 500 has one tri-state control signal TRI, with the capability to invert or disable the tri-state control for each nibble-wide group of four BI-DI buffers. Separate tri-state control for each nibble-wide group is achievable by using the SLIC cell's decoder output DEC, driven by the group of two BI-DI buffers, to control the tri-state of one BI-DI buffer nibble, while using the TRI signal to control the tri-state of the other BI-DI buffer nibble.

The functionality of SLIC cell 500 is parsed by the two nibble-wide groups 504 and 506 and the two-bit buffer group 508. Each of these groups may operate independently as BI-DI buffers (with or without tri-state capability for the nibble-wide groups) or as a logic function such as PAL or a decoder.

Table IV lists the programming of the different BI-DI buffer groups for eight different operational modes of SLIC cell 500. In each of these SLIC cell operational modes, each group of BI-DI buffers (504–508) is programmed to operate either as a group of buffers or as a decoder. As listed in Table IV, the operational modes of SLIC cell 500 provide different numerical combinations of BI-DI buffers operating as buffers and decoders.

TABLE IV

SLIC CELL OPERATIONAL MODES

| Mode | Nibble 504 | Nibble 506 | Group 508 | # of Buffers | # of Logic Inputs |
|---|---|---|---|---|---|
| I | Buffer | Buffer | Buffer | 10 | 0 |
| II | Buffer | Buffer | Decoder | 8 | 2 |
| III | Buffer | Decoder | Buffer | 6 | 4 |
| IV | Buffer | Decoder | Decoder | 4 | 6 |
| V | Decoder | Buffer | Buffer | 6 | 4 |
| VI | Decoder | Buffer | Decoder | 4 | 6 |
| VII | Decoder | Decoder | Buffer | 2 | 8 |
| VIII | Decoder | Decoder | Decoder | 0 | 10 |

Figure 6:
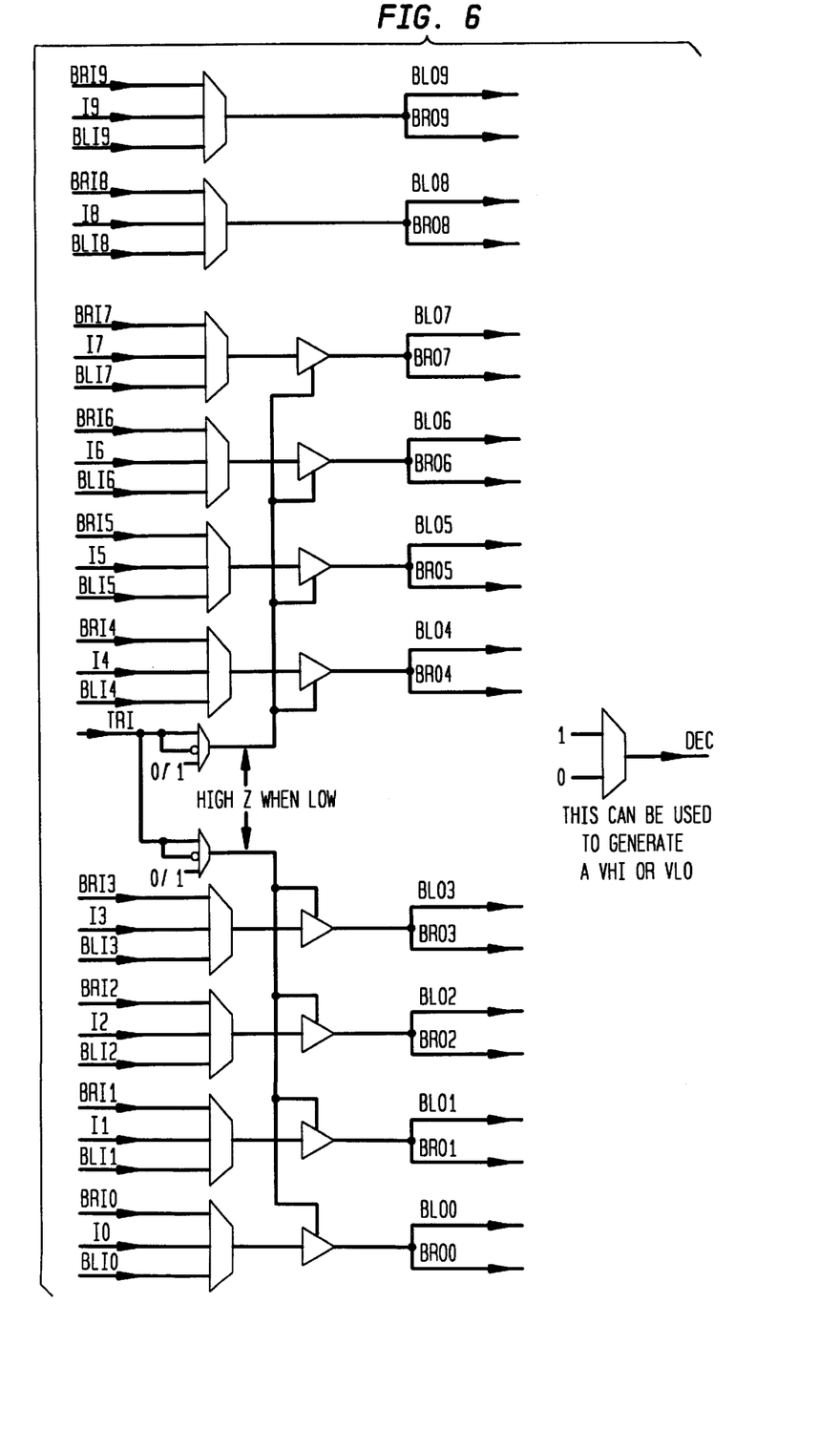
FIGS. 6–10 show the SLIC cell of FIG. 5 programmed to operate in five different SLIC cell modes of operation.
Figure 7:
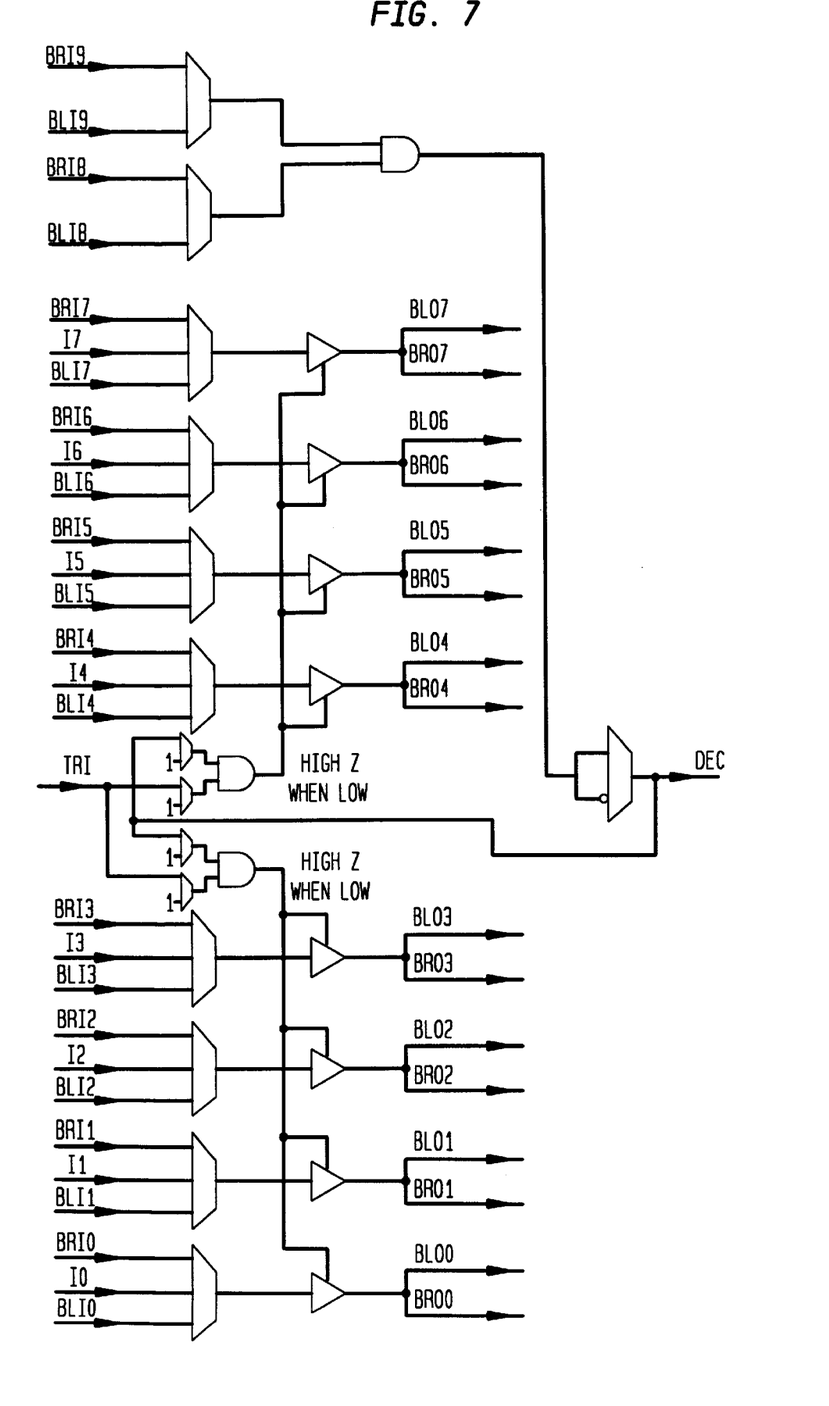
Figure 8:
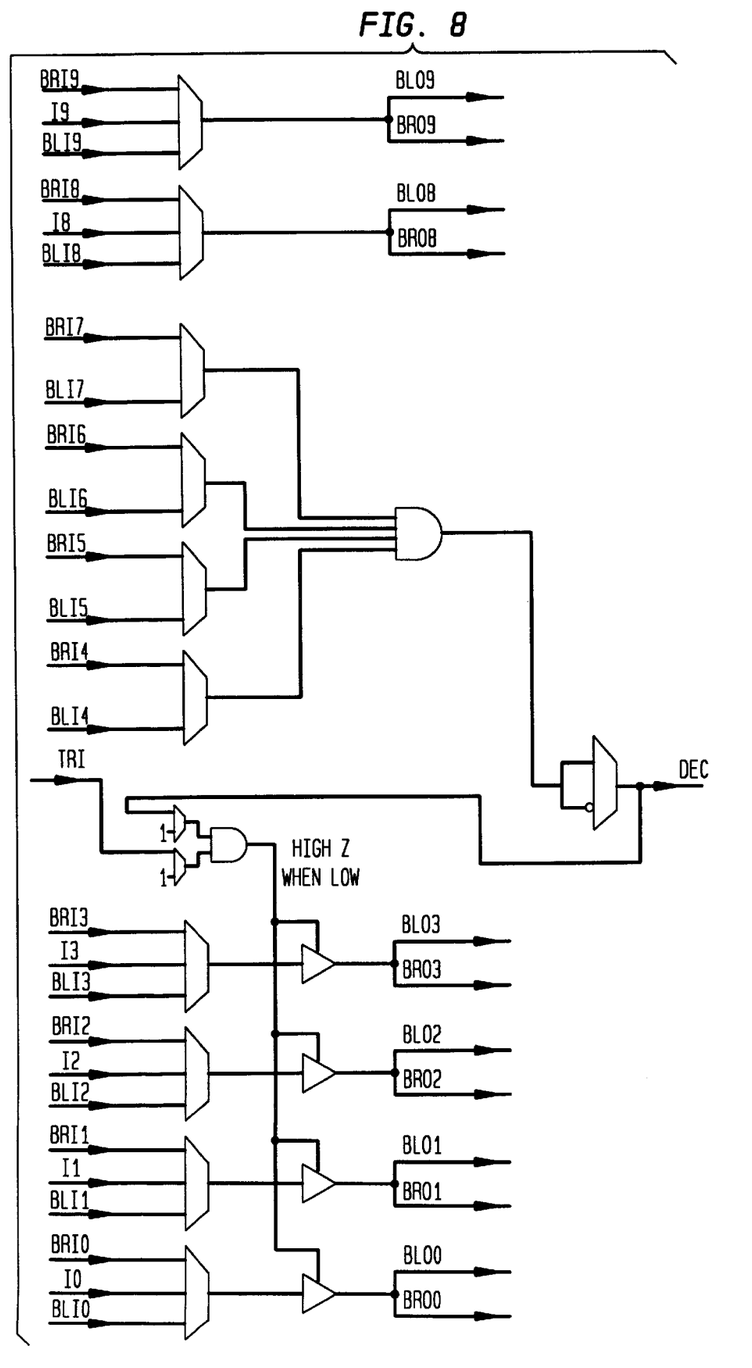
Figure 9:
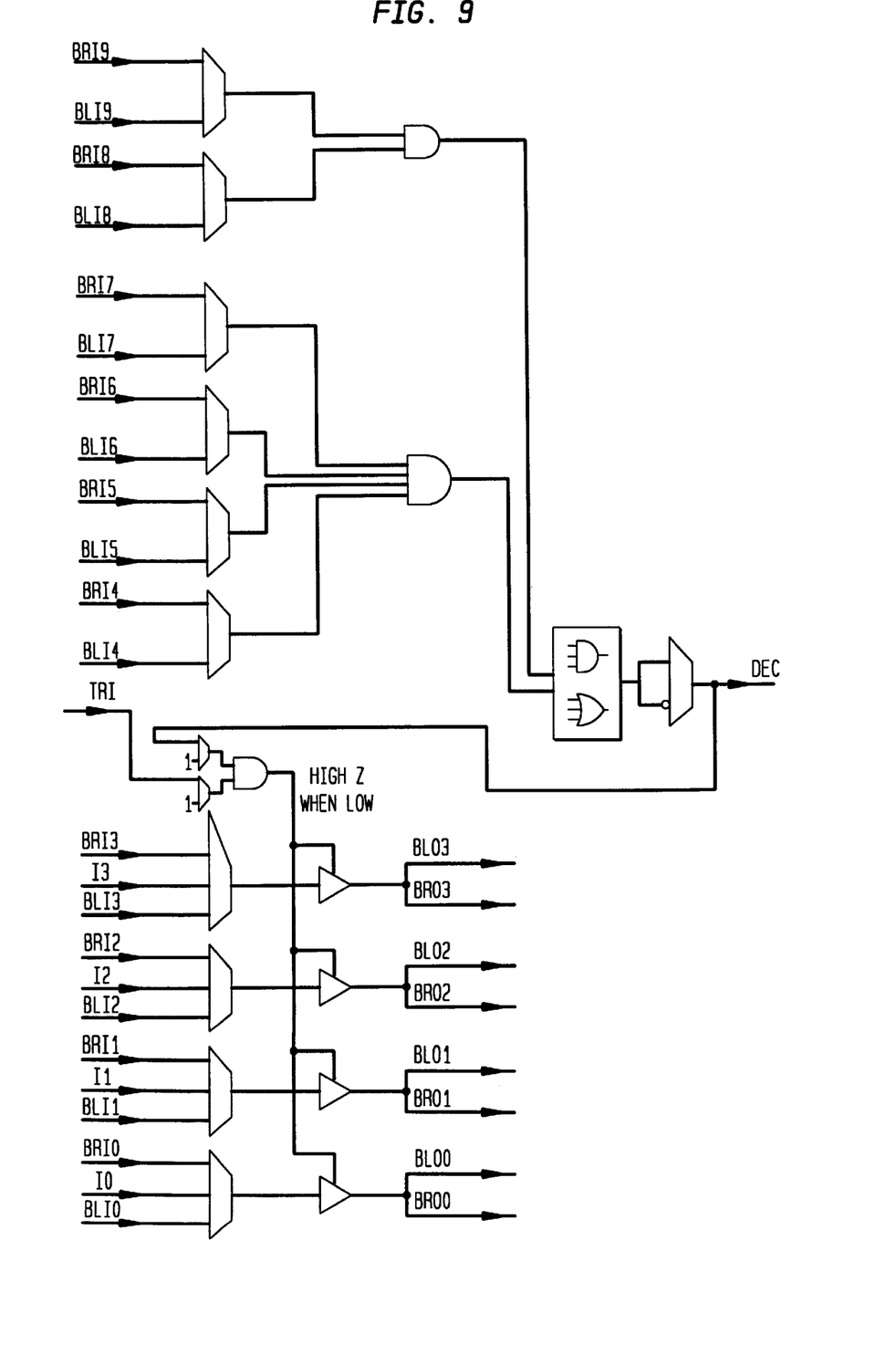
Figure 10:
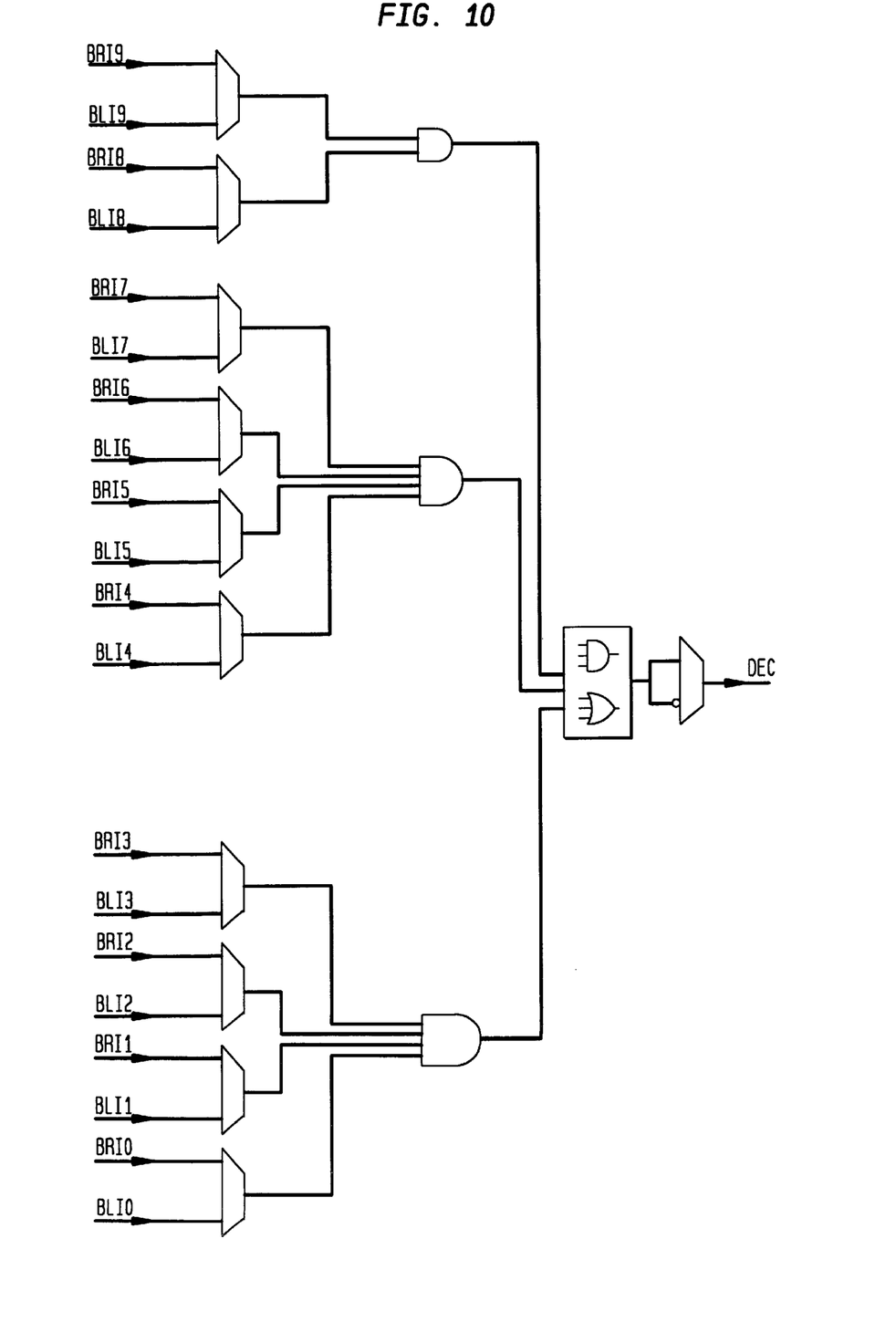

FIGS. 6–10 show SLIC cell 500 of FIG. 5 programmed to operate in five of the eight different SLIC cell operational modes of Table IV. FIGS. 6 and 7 show SLIC cell 500 in different buffering modes (Modes I and II, respectively), with available tri-state control from the TRI and DEC signals. For Mode I, with the entire SLIC cell acting in a buffer capacity, the DEC output may be used to generate a constant logic 1 (VHI) or logic 0 (VLO) signal for general use. FIGS. 8 and 9 show SLIC cell 500 programmed to generate decoder and PAL-like AND-OR-Invert functions (Modes III and IV), while FIG. 10 shows SLIC cell 500 programmed in full decoder mode as a 10-bit decoder (Mode VIII).

If SLIC cell 500 is programmed to operate in a mode having both buffers and a decode or AND-OR-Invert function (e.g., Mode II), the DEC output can be gated with the tri-state input signal TRI. This allows up to a 6-input decode (e.g., Modes IV and VI) plus the tri-state input to control the enable/disable of up to four buffers per SLIC cell.

In creating an FPGA, it is desirable to use as few configuration cells as possible, such as the SRAM cells used for control signals SEL_IN and SEL_INV described earlier with respect to BI-DI buffer 300 of FIGS. 3–4. As shown in FIG. 5, each BI-DI buffer in SLIC cell 500 is driven by a multiplexor (522 in FIG. 5) that receives three inputs. Since only one of these inputs can be used per BI-DI buffer, the configuration RAMs that are used to select the appropriate input can also be used to drive the SEL_IN and SEL_INV signals. As a result, the SLIC cells of the present invention do not require any more RAM cells than a conventional tri-state driver having three different inputs.

The embodiment of BI-DI 300 shown in the schematic drawing of FIG. 4 is just one possible implementation for the BI-DI buffers of the present invention. Many—if not innumerable—alternative implementations that achieve the same functionality are possible. When implemented using CMOS technology, pass gates like pass gate 310 of FIG. 4 are N threshold devices, while pass gates like pass gate 304 are P threshold devices. In alternative CMOS implementations for BI-DI 300, the combination of an inverting buffer and an N threshold pass gate, such as inverting buffer 312 and pass gate 310, can be replaced by a single P threshold pass gate. Similarly, each P threshold device such as pass gate 304 can be replaced by a combination of an inverting buffer and an N threshold pass gate.

Similarly, SLIC cell 500 of FIG. 5 is an example of only one possible logic cell that can be implemented using the BI-DI buffers of the present invention. In general, a logic cell of the present invention has one or more groups of BI-DI buffers, where each group comprises one or more BI-DI buffers and each group can be independently programmed to operate in one of a plurality of possible group operational modes, each BI-DI buffer in each group can be independently programmed to operate in one of a plurality of BI-DI operations modes, and there are one or more ways to interconnect the groups through routing or logic.

Although BI-DI buffer 300 of FIG. 3 and SLIC cell 500 of FIG. 5 have been described above in the context of implementation within an FPGA, it will be understood that the BI-DI buffers and/or SLIC cells of the present invention can be implemented in other devices, including, for example, mask-programmable gate arrays (MPGA). When implemented in an MPGA, the BI-DI buffers and/or SLIC cells are programmed in the factory, when the gate array is mask programmed.

The use of figure reference labels in the claims is intended to identify one or more possible embodiments of the claimed subject matter in order to facilitate the interpretation of the claims. Such labeling is not to be construed as necessarily limiting the scope of those claims to the embodiments shown in the corresponding figures.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A logic device, comprising one or more programmable bi-directional (BI-DI) buffers, wherein each BI-DI buffer is adapted to receive an input signal, to generate one or more output signals, and to be programmed to operate in any of the following operational modes:

(a) a simple buffer mode in which the input signal appears as one of the output signals;

(b) an inverting buffer mode in which an inverted version of the input signal appears as one of the output signals;

(c) a logic "0" mode in which one of the output signals corresponds to a logic "0" independent of the input signal;

(d) a logic "1" mode in which one of the output signals corresponds to a logic "1" independent of the input signal; and (e) a tri-state driver mode in which the BI-DI buffer functions as a tri-state driver under control of a tri-state control signal in order to generate one of the output signals.

2. The invention of claim 1, wherein each BI-DI buffer is further adapted to be programmed to operate in a sixth mode in which one of the output signals generated by the BI-DI buffer is either a fixed bias signal or indeterminate, as dictated by the tri-state control signal and independent of the input signal.

3. The invention of claim 2, wherein the fixed bias signal corresponds to a logic "1".

4. The invention of claim 1, wherein the logic device comprises two or more BI-DI buffers whose outputs are configured through logic gates to implement random logic.

5. The invention of claim 1, wherein the logic device comprises two or more BI-DI buffers whose outputs are configured through logic gates to function as a decoder.

6. The invention of claim 1, wherein the logic device is a programmable logic device (PLD).

7. The invention of claim 6, wherein the PLD is a field programmable gate array (FPGA).

8. The invention of claim 6, wherein the PLD comprises one or more programmable logic cells (PLCs), wherein at least one PLC of the PLD comprises two or more of the BI-DI buffers whose outputs are configured through logic gates to implement random logic or to function as a decoder.

9. The invention of claim 1, wherein each BI-DI buffer comprises:

(1) a first pass gate, configured to receive the input signal and to be turned on and off by a first control signal;

(2) a second pass gate, configured to received a bias signal and to be turned on and off by the first control signal;

(3) a third pass gate, configured to receive an inverted version of either the input signal or the bias signal, to be turned on and off by a second control signal, and to generate a second output signal;

(4) a fourth pass gate, configured to receive a twice-inverted version of either the input signal or the bias signal, to be turned on and off by the second control signal, and to generate the second output signal; and (5) a fifth pass gate, configured to receive a twice-inverted version of either the input signal or the bias signal, to be turned on and off by the tri-state control signal, and to generate a first output signal, wherein:

the first pass gate is configured to be off, when the second pass gate is on, and vice versa; and the third pass gate is configured to be off, when the fourth pass gate is on, and vice versa.

10. The invention of claim 9, wherein:

in the simple buffer mode, the input signal appears as the second output signal;

in the inverting buffer mode, the inverted version of the input signal appears as the second output signal;

in the logic "0" mode, the second output signal corresponds to a logic "0" independent of the input signal;

in the logic "1" mode, the second output signal corresponds to a logic "1" independent of the input signal; and in the tri-state driver mode, the BI-DI buffer functions as a tri-state driver under control of the tri-state control signal in order to generate the first output signal.

11. A logic device, comprising one or more logic cells, wherein at least one logic cell comprises two or more groups of BI-DI buffers, wherein each group comprises two or more BI-DI buffers and each group is adapted to be independently programmed to operate in any one of a plurality of possible group operational modes, wherein the plurality of possible group operational modes comprises a group buffer mode, in which a group of BI-DI buffers generates an output signal for each of the BI-DI buffers in the group, and a group decoder mode, in which a group of BI-DI buffers generates an output signal for all of the BI-DI buffers in the group.

12. The invention of claim 11, wherein each logic cell comprises three groups of BI-DI buffers, wherein a first group comprises four BI-DI buffers, a second group comprises four BI-DI buffers, and a third group comprises two BI-DI buffers.

13. The invention of claim 11, wherein each BI-DI buffer in each group in decoder mode can independently be ignored by being programmed to operate in logic "0" mode or logic "1" mode.

14. The invention of claim 11, wherein each BI-DI buffer in each group in decoder mode can be programmed independently to select either the inverting or non-inverting version of an input signal.

15. The invention of claim 11, wherein each BI-DI buffer is adapted to receive an input signal, to generate one or more output signals, and to be programmed to operate in any of the following operational modes:

(a) a simple buffer mode in which the input signal appears as one of the output signals;

(b) an inverting buffer mode in which an inverted version of the input signal appears as one of the output signals;

(c) a logic "0" mode in which one of the output signals corresponds to a logic "0" independent of the input signal;

(d) a logic "1" mode in which one of the output signals corresponds to a logic "1" independent of the input signal; and (e) a tri-state driver mode in which the BI-DI buffer functions as a tri-state driver under control of a tri-state control signal in order to generate one of the output signals.

16. The invention of claim 15, wherein each BI-DI buffer is further adapted to be programmed to operate in a sixth mode in which one of the output signals generated by the BI-DI buffer is either a fixed bias signal or indeterminate, as dictated by the tri-state control signal and independent of the input signal.

17. The invention of claim 15, wherein each BI-DI buffer comprises:

(1) a first pass gate, configured to receive the input signal and to be turned on and off by a first control signal;

(2) a second pass gate, configured to receive a bias signal and to be turned on and off by the first control signal;

(3) a third pass gate, configured to receive an inverted version of either the input signal or the bias signal, to be turned on and off by a second control signal, and to generate a second output signal;

(4) a fourth pass gate, configured to receive a twice-inverted version of either the input signal or the bias signal, to be turned on and off by the second control signal, and to generate the second output signal; and (5) a fifth pass gate, configured to receive a twice-inverted version of either the input signal or the bias signal, to be turned on and off by the tri-state control signal, and to generate a first output signal, wherein:

the first pass gate is configured to be off, when the second pass gate is on, and vice versa; and the third pass gate is configured to be off, when the fourth pass gate is on, and vice versa.

18. The invention of claim 17, wherein:

in the simple buffer mode, the input signal appears as the second output signal;

in the inverting buffer mode, the inverted version of the input signal appears as the second output signal;

in the logic "0" mode, the second output signal corresponds to a logic "0" independent of the input signal;

in the logic "1" mode, the second output signal corresponds to a logic "1" independent of the input signal; and in the tri-state driver mode, the BI-DI buffer functions as a tri-state driver under control of the tri-state control signal in order to generate the first output signal.

19. The invention of claim 11, wherein at least one logic cell comprises two or more of the BI-DI buffers whose outputs are configured through logic gates to implement random logic.

20. The invention of claim 11, wherein at least one logic cell comprises two or more of the BI-DI buffers whose outputs are configured through logic gates to function as a decoder.

21. The invention of claim 11, wherein the logic device is a PLD.

22. The invention of claim 21, wherein the PLD is an FPGA.

* * * * *